(12) United States Patent
Daigo et al.

(10) Patent No.: US 10,257,958 B2
(45) Date of Patent: Apr. 9, 2019

(54) CURRENT CONTROL APPARATUS AND MANUFACTURING METHOD FOR CURRENT CONTROL APPARATUS

(71) Applicant: Mitsubishi Electric Corporation, Tokyo (JP)

(72) Inventors: Toru Daigo, Tokyo (JP); Taisuke Iwakiri, Tokyo (JP); Yuji Kuramoto, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 206 days.

(21) Appl. No.: 15/251,533

(22) Filed: Aug. 30, 2016

(65) Prior Publication Data
US 2017/0251568 A1 Aug. 31, 2017

(30) Foreign Application Priority Data
Feb. 26, 2016 (JP) .................................. 2016-035359

(51) Int. Cl.
*H05K 7/20* (2006.01)
*H05K 5/03* (2006.01)
(Continued)

(52) U.S. Cl.
CPC ........... *H05K 7/20145* (2013.01); *G05F 1/00* (2013.01); *H05K 5/03* (2013.01); *H05K 5/06* (2013.01);
(Continued)

(58) Field of Classification Search
CPC ........ H05K 7/20145; H05K 5/03; H05K 5/06; H05K 7/20518; H05K 7/209; G05F 1/00; G01R 15/207
See application file for complete search history.

(56) References Cited

U.S. PATENT DOCUMENTS

| | | | |
|---|---|---|---|
| 2009/0201648 A1* | 8/2009 | Ganev | H05K 7/209 361/707 |
| 2017/0280577 A1* | 9/2017 | Laneryd | H05K 5/068 |

FOREIGN PATENT DOCUMENTS

| | | | | |
|---|---|---|---|---|
| CN | 102368432 A | | 3/2012 | |
| GB | 1063886 | * | 7/1964 | F25D 23/003 |

(Continued)

OTHER PUBLICATIONS

Preliminary Notice of Reasons for Rejection, dated Jan. 31, 2017.
(Continued)

*Primary Examiner* — Zeev V Kitov
(74) *Attorney, Agent, or Firm* — Sughrue Mion, PLLC; Richard C. Turner

(57) ABSTRACT

Provided is a current control apparatus including a first cooler that cools a switch element, a bus bar connected to the switch element, a core penetrated by the bus bar, a magneto-electric transducer, which is inserted into the core in order to detect a value of a current supplied to the switch element, a controller that controls the switch element, a case, and a cover, wherein the core includes an exposed disposal structure in which a part of the core is exposed to the exterior of the case as an exposed portion, and the current control apparatus further includes a divided cooling structure in which the exposed portion is cooled without being affected by the temperature of the first cooler that cools the switch element.

12 Claims, 4 Drawing Sheets

(51) Int. Cl.
*H05K 5/06* (2006.01)
*G05F 1/00* (2006.01)
*G01R 15/20* (2006.01)

(52) U.S. Cl.
CPC ......... *H05K 7/209* (2013.01); *H05K 7/20518* (2013.01); *G01R 15/207* (2013.01)

(56) References Cited

FOREIGN PATENT DOCUMENTS

| JP | S50-016415 U | 2/1975 |
| JP | 2001-86768 A | 3/2001 |
| JP | 2007-28785 A | 2/2007 |
| JP | 2015-012743 A | 1/2015 |

OTHER PUBLICATIONS

Communication dated Dec. 3, 2018 from the State Intellectual Property Office of the P.R.C. in counterpart CN application No. 201710096273.4.

\* cited by examiner

CURRENT CONTROL APPARATUS AND MANUFACTURING METHOD FOR CURRENT CONTROL APPARATUS

BACKGROUND OF THE INVENTION

1. Field of the Invention

This invention relates to a current control apparatus and a manufacturing method for the current control apparatus, with which a reduction in current detection precision due to the effects of heat generated by a switch element is suppressed, thereby enabling highly precise current detection such that an amount of current supplied to a connected inductive element can be controlled with a high degree of precision.

2. Description of the Related Art

An inverter or the like performs drive control on a motor by switching a current supply path along which a current is supplied from a power supply to respective coils of the motor by controlling a switch element. Further, by controlling a switch element, a transformer or the like adjusts an amount of current supplied from a power supply to a reactor, transforms a voltage generated by a power supply into a desired voltage, and outputs the desired voltage.

A motor or a transformer is formed from an inductive element (typically a coil). To control a torque of the motor, for example, an amount of current supplied to the coil is controlled.

A current control apparatus controls the amount of current supplied to the coil to a desired value by detecting the amount of current supplied to the coil as a current value and controlling a switch element on the basis of the detected current value.

The detected current value used during current control is obtained by a magneto-electric transducer attached to a core penetrated by a bus bar disposed in the current control apparatus.

When the bus bar is energized, a magnetic field corresponding to the current value is generated. The magneto-electric transducer detects the generated magnetic field via the core, and converts the magnetic field into a voltage corresponding to the magnetic field. Further, the voltage converted by the magneto-electric transducer is output to control means, whereupon the control means calculates a current flowing through the coil from the input voltage and controls the current.

Incidentally, an in-vehicle inverter is preferably capable of highly precise motor control in order to realize favorable operability and efficiency. To realize highly precise motor control, the current must be detected with a high degree of precision. The current detection precision is affected by the magnetic field detection precision of the magneto-electric transducer. The magnetic field detection precision is affected by characteristics of the magneto-electric transducer as well as the positional precision of the core and the magneto-electric transducer.

For example, a method for improving the positional precision of a core and a magneto-electric transducer by molding the core integrally with a case so that the core is fixed reliably has been proposed in the prior art (see Japanese Patent Application Publication No. 2007-028785, for example). Japanese Patent Application Publication No. 2007-028785 indicates that when the case and the core are molded integrally, the core can be prevented from moving in response to vibration generated during vehicle travel, and as a result, a distance between the core and the magneto-electric transducer can be kept constant at all times.

According to Japanese Patent Application Publication No. 2007-028785, therefore, a current can be detected with a high degree of precision without being affected by magnetic variation caused by movement of the core. As a result, current control can be performed with a high degree of precision, enabling highly efficient control motor control.

SUMMARY OF THE INVENTION

However, the prior art includes the following problems. To control an in-vehicle motor, a high voltage and a large current are supplied to the in-vehicle motor. When a large current is supplied to the in-vehicle motor, the current flowing through the switch element of the current control apparatus also increases, leading to an increase in heat generation. Therefore, a cooler must be attached to the switch element in order to cool the switch element.

The magneto-electric transducer, meanwhile, has a characteristic according to which the detection precision thereof deteriorates in response to a temperature increase. To realize highly precise current detection, therefore, an increase in the temperature of the magneto-electric transducer due to an increase in heat generation by the switch element must be suppressed.

To improve the current detection precision when current detection is performed using a magneto-electric transducer, the effects of circuit variation are corrected by learning the current value of the apparatus during a shipping inspection following assembly. To reduce the time spent on the shipping inspection, however, learning is often performed only at the temperature during the inspection and not with respect to other temperatures. In other words, when the temperature of the magneto-electric transducer increases above the temperature thereof at the time of current value learning, the current detection precision deteriorates.

The magneto-electric transducer itself does not generate heat. However, when the magneto-electric transducer is disposed in the same case as the switch element, the temperature in the interior of the case may increase due to the effects of the heat generated by the switch element, and as a result, the temperature of the magneto-electric transducer may increase above the temperature at the time of learning. In this case, therefore, the current detection precision deteriorates due to an increase in the temperature in the case of the current control apparatus.

FIG. 9 is a view showing a relationship between the temperature in the case of the current control apparatus proposed in Japanese Patent Application Publication No. 2007-028785 and a current detection error. The relationship between the temperature in the case and the current detection error will now be described using FIG. 9.

The abscissa in FIG. 9 shows the temperature in the case of the current control apparatus. The temperature in the case is raised by heat generated when the switch element is operated. The ordinate shows an error between a current value calculated by switch element control means mounted on a substrate and a current actually flowing through the bus bar. In FIG. 9, (a) denotes the current detection error relative to the temperature in the case when an increase in the temperature of the magneto-electric transducer is suppressed, while (b) in FIG. 9 denotes the current detection error relative to the temperature in the case when the temperature of the magneto-electric transducer is higher than the temperature in the case. This will now be described in detail.

In the current control apparatus proposed in Japanese Patent Application Publication No. 2007-028785, a cooler that is shared with the switch element is disposed below the core. By cooling the core using this cooler, the magneto-electric transducer, which is inserted into a gap provided in the core, is cooled such that an increase in the temperature of the magneto-electric transducer accompanying an increase in the temperature in the case is suppressed. The current detection error relative to the temperature in the case when an increase in the temperature of the magneto-electric transducer is suppressed corresponds to (a) in FIG. 9.

However, when a large current is passed through the current control apparatus proposed in Japanese Patent Application Publication No. 2007-028785 immediately after the apparatus is driven, (a) is not always realized. FIG. 10 is a view showing transitions of a temperature of the cooler and the temperature in the case over time when a large current is passed through the switch element. Variation in the temperature of the switch element cooler and the temperature in the case after starting to supply a current to the switch element will now be described using FIG. 10.

The abscissa in FIG. 10 shows the duration of energization, while the ordinate shows the temperature. In FIG. 10, (c) denotes the temperature of the switch element cooler and (d) denotes the temperature in the case. The heat generated by the switch element is conducted to gas in the interior of the case and the switch element cooler.

A non-flowing gas is used for thermal insulation and the like, and therefore exhibits lower thermal conductivity than a metal or plastic material. Meanwhile, metal or the like is used for the cooler to ensure that heat is transferred through the cooler easily, and therefore the thermal conductivity of the cooler is higher than that of the gas. Here, the thermal conductivity takes a steadily lower numerical value as the likelihood of warming decreases.

When a large current is supplied to the switch element, the amount of heat generated thereby is particularly large, and since the interior of the case is filled with gas exhibiting low thermal conductivity, the temperature of the cooler, which exhibits superior thermal conductivity to the gas, increases more quickly than the temperature in the case. When the temperature reaches saturation following the elapse of a certain amount of time, the temperature in the case becomes higher than the temperature of the cooler since the cooler is actively cooled. In other words, temperature transitions occur as shown by (c) and (d) in FIG. 10.

When a cooler that is shared by the switch element is used to cool the magneto-electric transducer, as in the current control apparatus proposed in Japanese Patent Application Publication No. 2007-028785, the heat generated by the switch element is conducted to the magneto-electric transducer via the cooler and the core. Hence, immediately after a current is supplied to the switch element, the temperature of the magneto-electric transducer becomes higher than the temperature in the case.

The current detection error of the magneto-electric transducer increases steadily as the temperature thereof rises above the learned temperature. Hence, in accordance with the characteristic illustrated by (b) in FIG. 9, the current detection error increases relative to the temperature in the case. Following the elapse of a certain amount of time, the temperature in the case also increases, eventually becoming higher than the temperature of the cooler. As a result, the temperature of the magneto-electric transducer decreases relative to the temperature in the case such that an identical condition to (a) is established.

When the current supplied to the switch element is low, the amount of heat generated by the switch element is small, and therefore the temperature of the switch element is not transferred to the magneto-electric transducer via the cooler and the core. Accordingly, the condition illustrated by (a), in which the temperature of the magneto-electric transducer is lower than the temperature in the case, is established.

When the current supplied to the switch element is high, on the other hand, the amount of heat generated by the switch element is large, and therefore the temperature of the switch element is transferred to the magneto-electric transducer via the cooler and the core. Accordingly, the condition illustrated by (b), in which the temperature of the magneto-electric transducer is higher than the temperature in the case, is established. As a result, the magnetic field detection precision of the magneto-electric transducer deteriorates, leading to corresponding deterioration of the current detection precision.

Hence, when a large current is passed through the current control apparatus immediately after the current control apparatus is driven, the current cannot be detected with a high degree of precision, and as a result, the amount of current supplied to an inductive element connected to the current control apparatus cannot be controlled with a high degree of precision.

A hybrid car in particular may be started in an operating mode in which only a motor is used to start the car while a gasoline engine remains stopped. When the hybrid car is started in this operating mode, the car can be started smoothly by driving the car in a low rotation region using a large amount of torque. Accordingly, the motor, which is capable of generating a large amount of torque even in the low rotation region, is used instead of the gasoline engine, which cannot easily generate a large amount of torque in the low rotation region.

In an operating mode in which the efficiency of the gasoline engine improves, however, the gasoline engine is used and the motor is stopped. By using energy efficiently in this manner, the fuel efficiency of the hybrid car improves.

When the current control apparatus is used in the startup operating mode, the current control apparatus supplies a large current to the motor via the switch element in order to generate a large amount of torque in the motor during startup. At this time, the switch element has not yet been driven, and therefore the temperature of the cooler and the temperature in the case of the current control apparatus are identical. When a large current is supplied in this condition, the condition illustrated by (c) is established with respect to the temperature of the cooler. Accordingly, the temperature condition illustrated by (c) produces the current detection error illustrated by (b), and as a result, an excessive current is passed through the motor.

In other words, the motor is operated with excessive sensitivity relative to a driver operation performed during startup, and therefore operational responsiveness deteriorates such that an energy-saving operation cannot be performed. Accordingly, excessive energy is consumed, and as a result, the fuel efficiency deteriorates.

This invention has been designed to solve the problems described above, and an object thereof is to obtain a current control apparatus and a manufacturing method for the current control apparatus, with which a reduction in the detection precision of a magneto-electric transducer due to the effects of heat generated by a switch element can be suppressed even when the magneto-electric transducer and the switch element are disposed in the same case, thereby enabling highly precise current detection such that an amount of current supplied to a connected inductive element can be controlled with a high degree of precision.

A current control apparatus according to this invention includes a switch element, a first cooler that cools the switch element, a bus bar connected to the switch element, a core penetrated by the bus bar, a magneto-electric transducer inserted into a gap provided in the core in order to detect a value of a current that flows through the bus bar so as to be supplied to the switch element, a controller that controls the switch element using the current value detected by the magneto-electric transducer, a case that houses the switch element, the core, the magneto-electric transducer, and the controller, and a cover provided to cover an opening portion of the case so that an interior of the case is hermetically sealed, wherein the core includes an exposed disposal structure in which a part of the core other than the gap is exposed to an exterior of the case as an exposed portion, and the current control apparatus further includes a divided cooling structure in which the exposed portion is cooled without being affected by a temperature of the first cooler that cools the switch element.

Further, a manufacturing method for a current control apparatus according to this invention is a method of manufacturing the current control apparatus having the configuration of this invention, and includes a step of integrally molding the core with the case in a condition where the exposed portion is exposed to the exterior of the case.

According to this invention, when the switch element and the magneto-electric transducer are disposed in the same case, a part of the core can be cooled while exposed to the exterior of the case, and the core can be disposed such that the temperature of the cooler that cools the switch element is not transferred directly thereto. As a result, it is possible to obtain a current control apparatus and a manufacturing method for the current control apparatus with which a reduction in the detection precision of a magneto-electric transducer due to the effects of heat generated by a switch element can be suppressed even when the magneto-electric transducer and the switch element are disposed in the same case, thereby enabling highly precise current detection such that an amount of current supplied to a connected inductive element can be controlled with a high degree of precision.

DESCRIPTION OF THE PREFERRED EMBODIMENTS

Preferred embodiments of a current control apparatus and a manufacturing method for a current control apparatus according to this invention will be described below with reference to the drawings. Note that identical reference symbols have been allocated to identical or corresponding parts of the drawings.

First Embodiment

Figure 1:
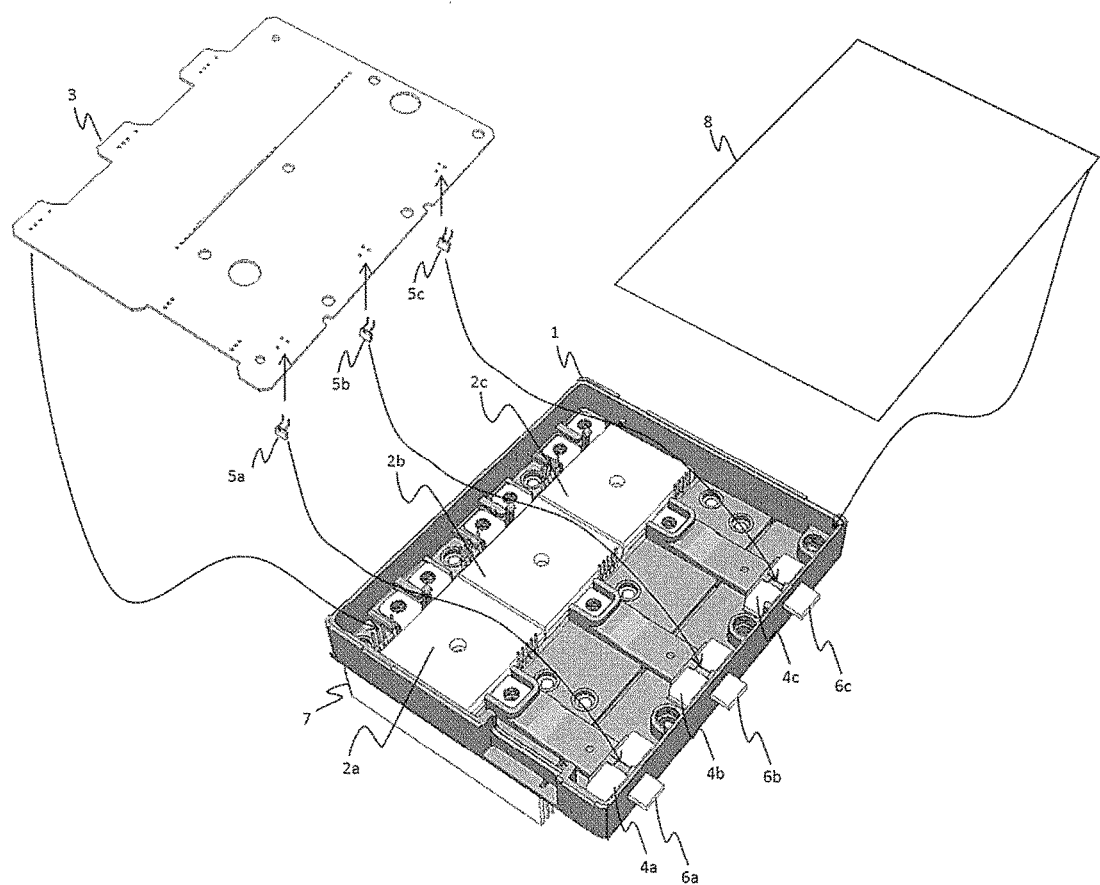
FIG. 1 is a view illustrating a current control apparatus according to a first embodiment of this invention.

FIG. 1 is a view illustrating a current control apparatus according to a first embodiment of this invention. The current control apparatus according to the first embodiment is configured to include a case 1, switch elements 2a, 2b, 2c, a substrate 3, cores 4a, 4b, 4c, magneto-electric transducers 5a, 5b, 5c, bus bars 6a, 6b, 6c, a cooler 7, and a cover 8.

As shown in FIG. 1, the respective switch elements 2a, 2b, 2c are mounted on the cooler 7 so as to be cooled by the cooler 7. The cooler 7, to which heat generated by the elements 2a, 2b, 2c is conducted, is cooled either by natural convection or by forced convection using a convective flow of outside air, forced air cooling, water cooling, or the like.

The bus bars 6a, 6b, 6c are connected respectively to the switch elements 2a, 2b, 2c, and penetrate the case 1 so as to project to the case exterior. The cores 4a, 4b, 4c are attached so as to be penetrated respectively by the bus bars 6a, 6b, 6c. Gaps are provided in the respective cores 4a, 4b, 4c, and the magneto-electric transducers 5a, 5b, 5c are inserted respectively into the gaps.

The substrate 3 is connected to the switch elements 2a, 2b, 2c and the magneto-electric transducers 5a, 5b, 5c. Control means for controlling the switch elements 2a, 2b, 2c is mounted on the substrate 3. Further, the control means converts voltage values input from the magneto-electric transducers 5a, 5b, 5c into current values.

The case 1 is formed to surround the substrate 3, and when the case 1 is molded, the bus bars 6a, 6b, 6c are molded integrally with the case 1 so as to penetrate the respective cores 4a, 4b, 4c. The cover 8 is attached to an upper portion of the case 1 so that the interior of the case 1 is hermetically sealed. As a result, a temperature difference arises between the case exterior and the case interior.

Next, a current detection method will be described. The bus bars 6a, 6b, 6c respectively generate magnetism corresponding to currents supplied thereto. The generated magnetism passes through the cores 4a, 4b, 4c. The magneto-electric transducers 5a, 5b, 5c detect magnetic flux in the gaps in the cores 4a, 4b, 4c, convert the magnetic flux into voltages, and output the voltages.

In other words, the magneto-electric transducers 5a, 5b, 5c detect the magnetic flux generated in the gaps in the cores 4a, 4b, 4c and convert the magnetic flux into voltages. At this time, the voltages output respectively by the magneto-electric transducers 5a, 5b, 5c are commensurate with respective densities of the magnetic flux in the gaps in the cores 4a, 4b, 4c.

The control means mounted on the substrate 3 converts the voltage values input respectively from the magneto-electric transducers 5a, 5b, 5c into current values. Thus, the current control apparatus can detect the current values supplied to the bus bars 6a, 6b, 6c.

Next, a current control method will be described. The control means outputs control signals to the respective switch elements 2a, 2b, 2c. The switch elements 2a, 2b, 2c are ON/OFF controlled in accordance with the input control signals.

The control means can supply a current to an inductive element connected to the current control apparatus by outputting an ON command. An amount of current supplied to the inductive element can be controlled in accordance with an ON/OFF ratio of the switch elements 2a, 2b, 2c. An ON time is controlled using a difference between target current values commanded by the control means and the current values supplied to the bus bars 6a, 6b, 6c, detected using the method described above. Thus, the current control apparatus controls the currents.

Figure 2:
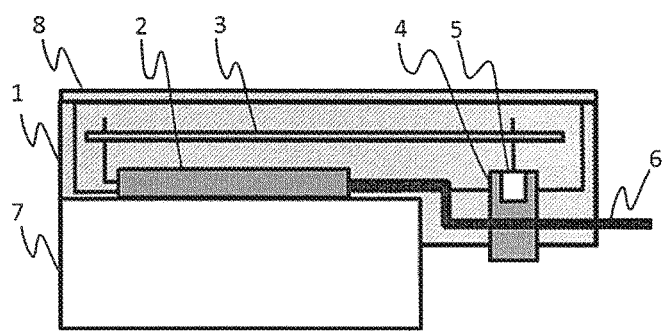
FIG. 2 is a sectional view of the current control apparatus according to the first embodiment of this invention.

Next, a method of suppressing a reduction in current detection precision due to heat generation by the switch elements, which is a feature of this invention, will be described using FIG. 2. FIG. 2 is a sectional view of the current control apparatus according to a first embodiment of this invention. More specifically, FIG. 2 is a sectional view taken from FIG. 1 by cutting one of the magneto-electric transducers 5a, 5b, 5c in a short side direction.

A switch element 2 denotes one of the switch elements 2a, 2b, 2c, a core 4 denotes one of the cores 4a, 4b, 4c, a magneto-electric transducer 5 denotes one of the magneto-electric transducers 5a, 5b, 5c, and a bus bar 6 denotes one of the bus bars 6a, 6b, 6c.

As shown in FIG. 2, a part of the core 4 is exposed to the exterior of the case 1 as an exposed portion. Further, the cooler 7 is disposed in a position where heat from the cooler 7 is not conducted directly to the core 4. More specifically, the cooler 7 is not disposed below the core 4. As a result, heat from the cooler 7 is not conducted to the core 4 without passing through the case 1, gas in the case, and outside air on the case exterior. Further, the case 1, the gas in the case, and the outside air on the case exterior all exhibit lower thermal conductivity than the cooler 7.

Heat from the cooler 7 is not conducted directly to the core 4, and therefore heat from the switch element 2 is not conducted actively to the magneto-electric transducer 5 via the cooler 7. Further, a part of the core 4 is exposed to the exterior of the case 1. Therefore, the core 4 is cooled directly by a convective flow of outside air having a lower temperature than the temperature in the case. As a result, the temperature of the core 4 falls below the temperature in the case.

Hence, the temperature of the magneto-electric transducer 5 can be suppressed to be lower than the temperature inside the case even when a large current is passed through the switch element 2 such that the temperature of the cooler 7 increase above the temperature in the case due to the heat generation by the switch element 2. In other words, a reduction in the detection precision of the magneto-electric transducer 5 can be suppressed such that the current can be detected with a high degree of precision.

According to the first embodiment, as described above, the core includes an exposed disposal structure in which a part of the core other than the gap in which the magneto-electric transducer is inserted is exposed to the case exterior as an exposed portion. Further, the current control apparatus includes a structure for cooling the exposed portion directly using outside air as a divided cooling structure in which the exposed portion is cooled without being affected by the temperature of the cooler that cools the switch element.

Hence, even when the magneto-electric transducer and the switch element are disposed in the same case, a part of the core can be cooled while exposed to the case exterior, and the core can be disposed such that the temperature of the cooler that cools the switch element is not transferred directly thereto. Accordingly, an increase in a detection error and a reduction in the current detection precision accompanying an increase in the temperature of the magneto-electric transducer due to the heat generated by the switch element can be suppressed, thereby enabling highly precise current detection such that the amount of current supplied to the connected inductive element can be controlled with a high degree of precision.

Second Embodiment

In the first embodiment, a configuration in which the cooler 7 is disposed in a position where the heat of the cooler 7 is not conducted directly to the core 4 was described. In a second embodiment, on the other hand, a configuration in which the core 4 is cooled actively using an individual, core-dedicated cooler provided separately to the cooler 7, which is disposed directly beneath the switch element 2, will be described.

Figure 3:
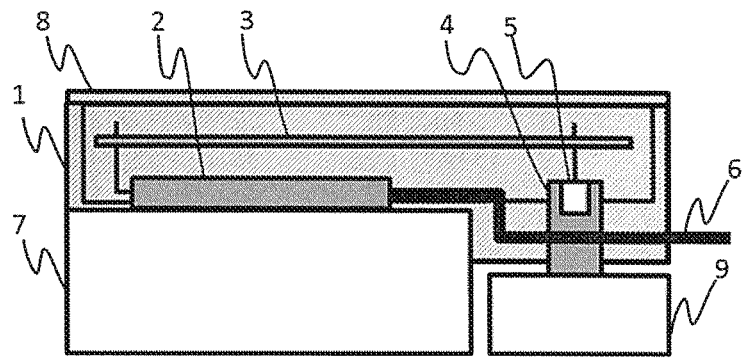
FIG. 3 is a sectional view illustrating an example of a current control apparatus according to a second embodiment of this invention.

FIG. 3 is a sectional view illustrating an example of a current control apparatus according to the second embodiment of this invention. A configuration shown in FIG. 3 differs from the configuration shown in FIG. 2 in that a different cooler 9 from the cooler 7 for cooling the switch element 2 is newly provided, and the core 4 is cooled by the cooler 9. The following description focuses on the configuration for cooling the core 4 using the cooler 9.

The current control apparatus according to the second embodiment includes a structure in which the cooler 9 is attached to the core 4 as the divided cooling structure for cooling the exposed portion. Heat from the core 4 is conducted to the cooler 9, and is cooled either by natural convection heat transfer or by forced convection heat transfer using a convective flow of outside air, forced air cooling, water cooling, or the like.

It is assumed here that the cooler 9 exhibits a more favorable cooling performance than outside air. Further, the cooler 9 is provided individually as a different component from the cooler 7 of the switch element 2, and the cooler 9 is disposed at a remove from the cooler 7 so that the temperature of the cooler 7 is not transferred directly to the cooler 9.

Furthermore, by setting the volume and surface area of the cooler 9 and the coolant used thereby to be different from the cooler 7, the cooler 9 can be set to exhibit a different cooling performance from the cooler 7. As a result, the cooler 9 can cool the core 4 to a desired temperature independently of the cooler 7.

The core 4 is cooled by the cooler 9, and therefore, by cooling the core 4 to a desired temperature, the magneto-electric transducer 5 inserted into the gap in the core 4 can be set at a desired temperature. In other words, by designing the desired temperature appropriately, the magneto-electric transducer 5 can maintain a high degree of precision during learning regardless of the temperature in the case 1. As a result, the current can be detected with a high degree of precision.

In the first embodiment, a structure in which the core 4 is cooled using outside air is employed as the divided cooling structure for cooling the exposed portion. In the second embodiment, on the other hand, as described above, a structure for improving the cooling performance by disposing the cooler 9 separately from the cooler 7 so that the temperature of the cooler 7 is not transferred directly thereto, setting the cooling performance of the cooler 9 such that a desired temperature is obtained, and cooling the magneto-electric transducer 5 via the core 4 is employed as the divided cooling structure.

Accordingly, a high degree of precision can be maintained in the magneto-electric transducer 5 during learning regardless of temperature increases in the case 1 due to the heat generated by the switch element 2, and as a result, the current can be detected with a high degree of precision such that the amount of current supplied to the connected inductive element can be controlled precisely.

According to the second embodiment, as described above, a divided cooling structure for actively cooling the core is provided using an individual, core-dedicated cooler in addition to the cooler disposed directly beneath the switch element, as described in the first embodiment. Hence, the current can be detected using the magneto-electric transducer with a high degree of precision regardless of temperature increases in the case due to the heat generated by the switch element, and as a result, the amount of current supplied to the connected inductive element can be controlled precisely.

In particular, by setting the cooling performance of the core-dedicated cooler such that the desired temperature is obtained, current detection can be performed with a higher degree of precision than when the exposed portion is cooled by outside air.

Third Embodiment

In a third embodiment, a configuration in which the cooling effect obtained in relation to the core 4 is improved by providing a duct in the cooler 7 instead of employing the core-dedicated cooler 9 will be described.

Figure 4:
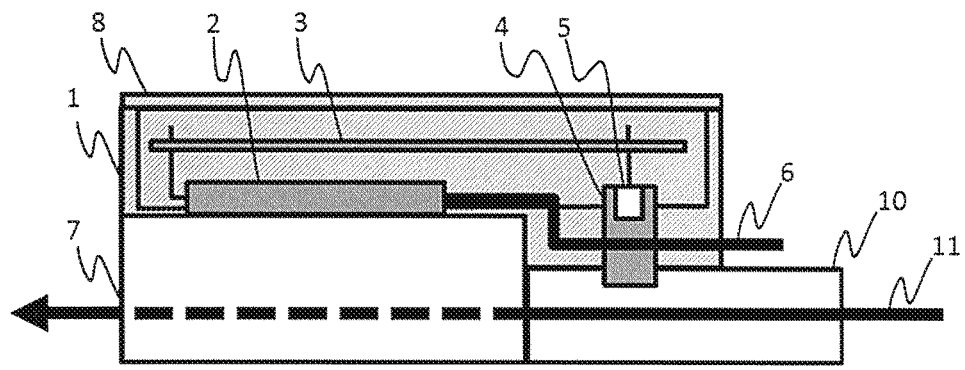
FIG. 4 is a sectional view illustrating an example of a current control apparatus according to a third embodiment of this invention.

FIG. 4 is a sectional view illustrating an example of a current control apparatus according to a third embodiment of this invention. A configuration shown in FIG. 4 differs from the configuration shown in FIG. 2 in that a duct 10 is provided in the cooler 7 of the switch element 2 so that when a coolant is cooled by forced convection, the coolant is also used actively to cool the core 4. A technical feature of the third embodiment, in which the coolant flowing through the duct is used actively as the divided cooling structure for cooling the exposed portion, will be described below.

To cool the cooler 7 more favorably, the duct 10 may be attached to an inlet of the cooler 7, as shown in FIG. 4, so that the coolant is cooled by forced convection. By attaching the duct 10, a flow rate and a direction of the coolant can be controlled, and as a result, the cooler 7 can be cooled more favorably.

At this time, the duct 10 is attached to the inlet of the cooler 7 such that an upper portion of the duct 10, positioned below the case 1, is opened and the exposed portion of the core 4 is inserted into the duct 10. In so doing, the coolant also contacts the core 4 so that the core 4 is cooled thereby.

By employing this divided cooling structure, the core 4 can be cooled by the coolant with greater stability than when the core 4 is contacted by outside air, as in the first embodiment. Further, by setting a coolant direction 11 as the flow direction of the coolant, as shown in FIG. 4, heat from the cooler 7 can be discharged in an opposite direction to the core 4. As a result, conduction of the heat of the cooler 7 to the core 4 can be prevented.

Furthermore, by controlling the temperature of the coolant, the temperature of the core 4, which comes into direct contact with the coolant, can be controlled to a desired temperature. Accordingly, the magneto-electric transducer 5 can also be controlled to a desired temperature. In other words, the temperature of the magneto-electric transducer 5 can be set at the temperature during learning regardless of the temperature in the case 1, and therefore similar effects to the second embodiment can be obtained.

Moreover, by employing the coolant as the means for cooling the core 4, the core 4 can be cooled to the desired temperature even in a case where the cooler 9 cannot be attached to the core 4. In contrast to the second embodiment, therefore, the cooler 9 is not required, leading to a corresponding reduction in weight. Furthermore, in the divided cooling structure according to the third embodiment, the switch element 2 and the core 4 are cooled using the shared cooler 7 and the shared coolant. Hence, the individual cooler 9 for cooling the core 4 is not required, and therefore the core 4 can be cooled with a simple configuration.

According to the third embodiment, as described above, a divided cooling structure in which a duct is attached to the cooler for cooling the switch element so that the core is cooled actively by the coolant flowing through the duct is provided instead of using an individual, core-dedicated cooler. As a result, similar effects to the second embodiment can be obtained with a simpler configuration.

Fourth Embodiment

In a fourth embodiment, a method of achieving uniformity among cooling effects obtained in relation to respective cores in a current control apparatus having a plurality of cores will be described. More specifically, a layout with which uniformity can be achieved among cooling effects obtained in relation to the three cores 4a, 4b, 4c when a curved duct 10 is employed in the configuration of the third embodiment will be described.

Figure 5:
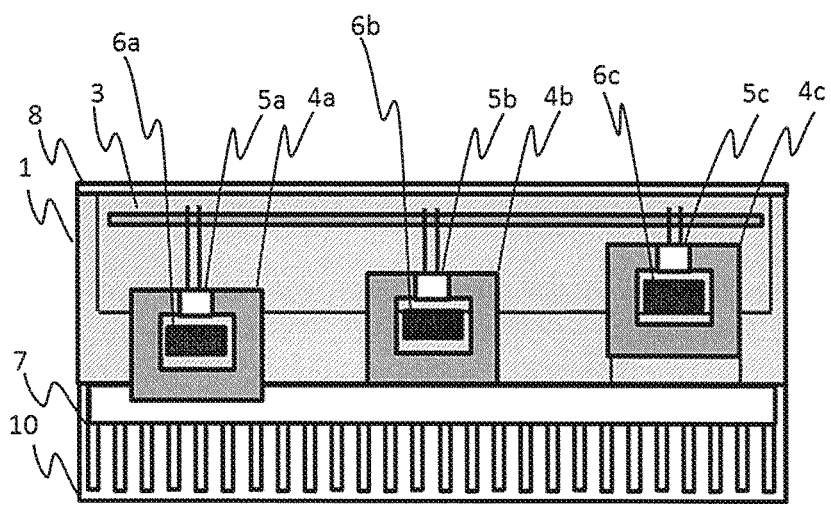
FIG. 5 is a sectional view illustrating an example of a current control apparatus according to a fourth embodiment of this invention.

FIG. 5 is a sectional view illustrating an example of a current control apparatus according to a fourth embodiment of this invention. FIG. 5 shows a cross-section cut in a long side direction of the current control apparatus in the position of the magneto-electric transducers 5a, 5b, 5c. As shown in FIG. 5, the cores 4a, 4b, 4c are molded integrally with the case 1 such that the respective exposed portions thereof are exposed in a form that projects from the case 1, a form that is parallel to the case 1, and a form that is recessed within the case 1.

Next, a case in which the duct 10 is attached to the inlet of the cooler 7, as described above in the third embodiment, will be considered. The duct 10 does not necessarily have to be formed in a rectilinear shape. A case in which the duct 10 is curved, for example, will now be described using FIG. 6.

Figure 6:
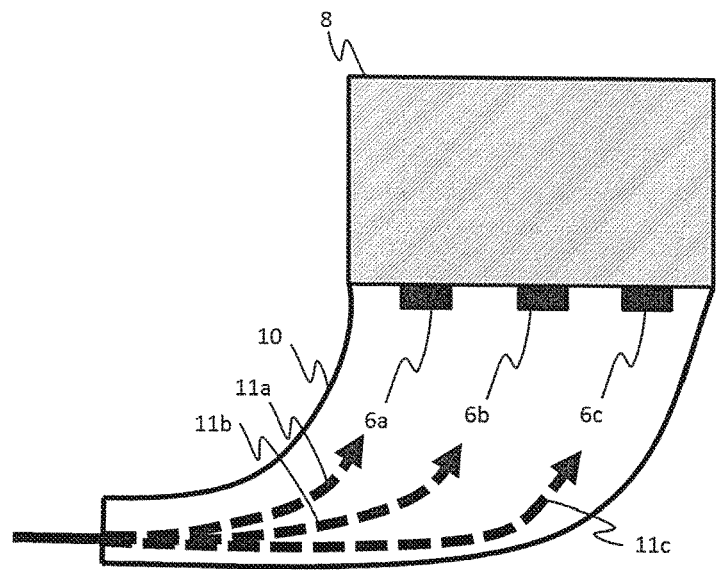
FIG. 6 is a sectional view taken in a short side direction of the current control apparatus according to the fourth embodiment of this invention.

FIG. 6 is a sectional view taken in a short side direction of the current control apparatus according to the fourth embodiment of this invention. More specifically, FIG. 6 shows a cross-section cut in the short side direction of the current control apparatus in the position of the magneto-electric transducer 5c, and shows an upper surface of the current control apparatus.

Figure 7:
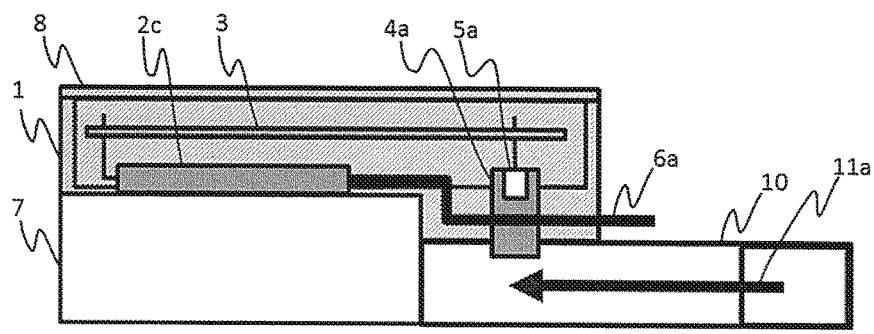
FIG. 7 is a sectional view illustrating an example of the current control apparatus according to the fourth embodiment of this invention.

Further, FIG. 7 is a sectional view illustrating an example of the current control apparatus according to the fourth embodiment of this invention. As shown in FIG. 7, the curved duct 10 shown in FIG. 6 is attached to the inlet of the cooler 7. Furthermore, dotted line arrows in FIG. 6 indicate coolant directions 11a, 11b, 11c of the coolant that flows through the curved duct 10 in order to cool the cooler 7.

When the curved duct 10 is attached to the current control apparatus, a relationship of coolant direction 11a<coolant direction 11b<coolant direction 11c is obtained with respect to the flow speeds of the coolant through the curved duct 10. In other words, the flow speed of the coolant that flows along a wall side of the curved duct 10 on which the curve angle is large (i.e. in the coolant direction 11a) decreases while the flow speed of the coolant that flows along a wall side of the curved duct 10 on which the curve angle is small (i.e. in the coolant direction 11c) increases.

When the curved duct 10 shown in FIG. 6 is employed as the duct 10 of the third embodiment, shown in FIG. 4, the cooling performances obtained respectively in relation to the cores 4a, 4b, 4c improve steadily as the flow speed of the coolant increases. Hence, the core 4c that is contacted by the coolant having the highest flow speed is cooled to the greatest degree.

In other words, when the curved duct 10 is used, different degrees of cooling are obtained in relation to the respective magneto-electric transducers 5a, 5b, 5c, and therefore the respective temperatures of the magneto-electric transducers 5a, 5b, 5c are not uniform. As a result, the current detection error differs in each phase in accordance with the magneto-electric transducer 5a, 5b, 5c, the detection precision of which is temperature-dependent.

When the curved duct 10 is attached to the current control apparatus according to the third embodiment, a temperature relationship of core 4a>core 4b>core 4c is obtained among the cores 4a, 4b, 4c in accordance with the cooling conditions of the cores 4a, 4b, 4c.

In the magneto-electric transducers 5a, 5b, 5c, meanwhile, the detection error increases steadily as the temperature thereof increases. Hence, a relationship of magneto-electric transducer 5a>5b>5c is obtained with respect to the current detection error.

When the bus bar 6a is set as an A phase, the bus bar 6b is set as a B phase, and the bus bar 6c is set as a C phase, a relationship of A phase>B phase>C phase, in descending order, is obtained with respect to the errors in the currents controlled by the current control apparatus.

When a motor is connected to the current control apparatus, smooth rotation by the motor is closely related to balance among the A phase, B phase, and C phase currents output by the current control apparatus. When the A phase, B phase, and C phase currents are imbalanced, a current ripple increases, and as a result, the motor cannot rotate smoothly, leading to a reduction in operability. To suppress this reduction in operability even when current detection errors exist, the values of the current detection errors are preferably set to be uniform among the A phase, the B phase, and the C phase.

A method of achieving uniformity in the current detection errors of the respective phases when the curved duct 10 is used will now be described. As shown in FIG. 5, the core 4a is disposed such that the exposed portion thereof is exposed in a form that projects from the case 1. Therefore, a surface area corresponding to the part that is exposed from the case 1 is cooled by the coolant.

The core 4b is disposed such that the exposed portion thereof is exposed in a form that is parallel to the case 1. Therefore, the area of the bottom surface of the core 4b is cooled by the coolant. The core 4c is disposed such that the exposed portion thereof is exposed in a form that is recessed within the case 1. Therefore, when the coolant flows toward the cooler 7, the recessed shape serves as resistance, leading to a reduction in the flow speed of the coolant, and as a result, the area of the bottom surface of the core 4c is cooled by the coolant.

Hence, a relationship of core 4a>core 4b>core 4c, in ascending order, is obtained with respect to the cooling performances realized by this exposed disposal structure.

Meanwhile, a relationship of coolant direction 11a<coolant direction 11b<coolant direction 11c is obtained with respect to the flow speed of the coolant flowing through the curved duct 10. This relationship corresponds to the magnitude relationship between the cooling performances obtained with the divided cooling structure.

More specifically, the core 4a exhibiting a strong cooling performance is disposed on the path of the coolant that flows in the coolant direction 11a and exhibits a weak cooling performance, the core 4c exhibiting a weak cooling performance is disposed on the path of the coolant that flows in the coolant direction 11c and exhibits a strong cooling performance, and the core 4b exhibiting a weaker cooling performance than the core 4a but a stronger cooling performance than the core 4c is disposed on the path of the coolant that flows in the coolant direction 11b and exhibits a stronger cooling performance than the coolant flowing in the coolant direction 11a but a weaker cooling performance than the coolant flowing in the coolant direction 11c.

By disposing the cores 4a, 4b, 4c in this manner, a temperature relationship of core 4a=core 4b=core 4c can be obtained among the cores 4a, 4b, 4c when the coolant is passed through the curved duct 10.

In other words, even when the curved duct 10 is employed, a total cooling performance achieved with the exposed disposal structure and the divided cooling structure can be made uniform among all of the cores 4a, 4b, 4c. As a result, identical detection errors can be obtained in the magneto-electric transducers 5a, 5b, 5c.

Further, the fourth embodiment, similarly to the third embodiment, is structured such that heat is not transferred directly to the cores 4a, 4b, 4c from the cooler 7, and therefore similar effects to the third embodiment are obtained.

According to the fourth embodiment, as described above, by employing the layout shown in FIG. 5 in order to make the total cooling performance uniform, balance can be achieved among the currents of the A phase, the B phase, and the C phase even when a curved duct is used. Hence, a three-phase current having a small current ripple can be controlled and supplied with a high degree of precision, and as a result, the motor can be controlled to rotate smoothly.

Fifth Embodiment

In a fifth embodiment, a case in which the total cooling effect obtained in relation to the respective cores of a current control apparatus having a plurality of cores is made uniform using a different method from the fourth embodiment will be described. More specifically, a layout with which uniformity can be achieved in the cooling effects obtained in relation to the three cores 4a, 4b, 4c when the curved duct 10 is used in a configuration employing the core-dedicated cooler of the second embodiment will be described.

Figure 8:
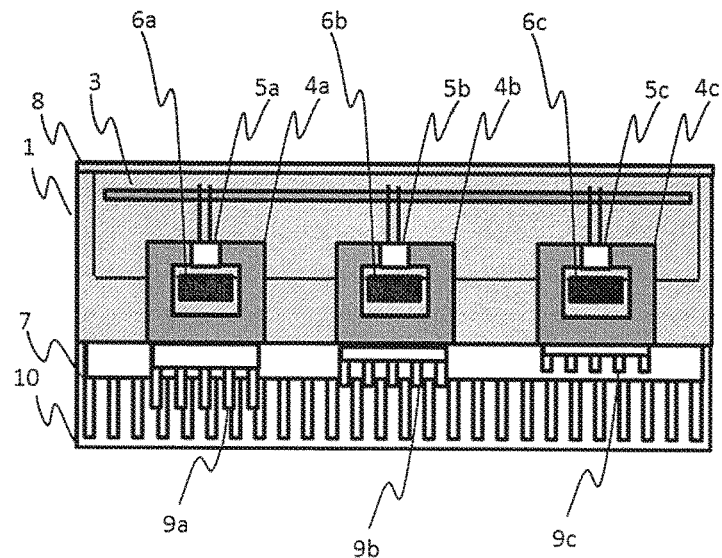
FIG. 8 is a sectional view illustrating an example of a current control apparatus according to a fifth embodiment of this invention.
Figure 9:
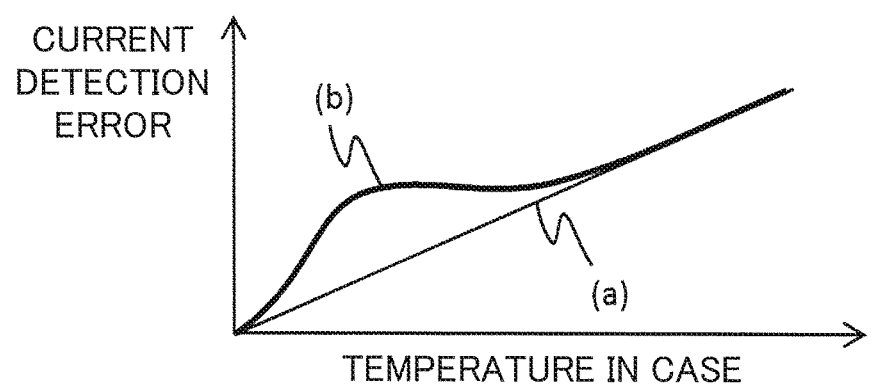
FIG. 9 is a view showing a relationship between a temperature in a case of a current control apparatus proposed in Japanese Patent Application Publication No. 2007-028785 and a current detection error.
Figure 10:
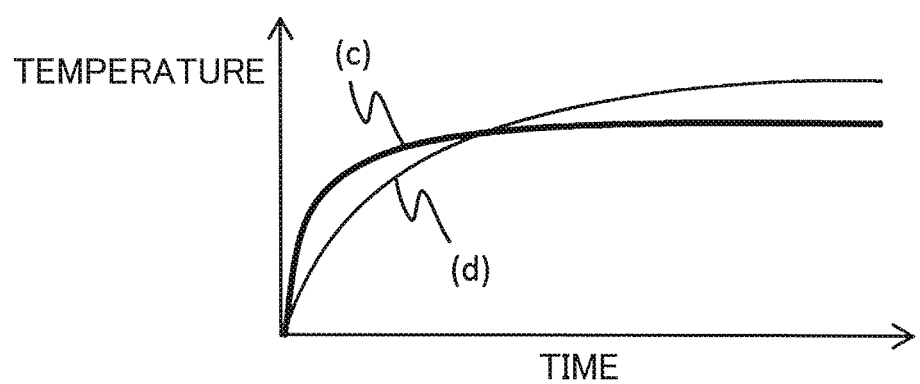
FIG. 10 is a view showing transitions of a temperature of a cooler and the temperature in the case over time when a large current is passed through a switch element.

FIG. 8 is a sectional view illustrating an example of the current control apparatus according to the fifth embodiment of this invention. A configuration shown in FIG. 8 differs from the configuration shown in FIG. 5 in that core-dedicated coolers 9a, 9b, 9c are provided with respect to the cores 4a, 4b, 4c separately to the cooler 7 for cooling the switch elements 2a, 2b, 2c.

The cores 4a, 4b, 4c are molded integrally with the case 1 at identical heights. Further, the coolers 9a, 9b, 9c, which have a cooling performance relationship of cooler 9a>cooler 9b>cooler 9c, are disposed individually with respect to the cores 4a, 4b, 4c. Note that the respective coolers 9a, 9b, 9c are disposed independently such that temperature effects are not transferred directly between the coolers 9a, 9b, 9c.

The temperatures of the cores 4a, 4b, 4c are respectively dependent on the cooling performances of the coolers 9a, 9b, 9c. Therefore, when the coolant flows at a constant flow speed, a relationship of core 4a>core 4b>core 4c is obtained with respect to the cooling performances of the cores 4a, 4b, 4c.

When the curved duct 10 is employed, a relationship of coolant direction 11a<coolant direction 11b<coolant direction 11c is obtained with respect to the flow speed of the coolant flowing through the curved duct 10.

Accordingly, the core 4a exhibiting a strong cooling performance is disposed on the path of the coolant that flows in the coolant direction 11a and exhibits a weak cooling performance, the core 4c exhibiting a weak cooling performance is disposed on the path of the coolant that flows in the coolant direction 11c and exhibits a strong cooling performance, and the core 4b exhibiting a weaker cooling performance than the core 4a but a stronger cooling performance than the core 4c is disposed on the path of the coolant that flows in the coolant direction 11b and exhibits a stronger cooling performance than the coolant flowing in the coolant direction 11a but a weaker cooling performance than the coolant flowing in the coolant direction 11c.

By disposing the cores 4a, 4b, 4c in this manner, a temperature relationship of core 4a=core 4b=core 4c can be realized among the cores 4a, 4b, 4c when the coolant is passed through the curved duct 10.

In other words, even when the curved duct 10 is employed, the total cooling performance achieved with the exposed disposal structure and the divided cooling structure can be made uniform among all of the cores 4a, 4b, 4c. As a result, similar effects to the fourth embodiment can be obtained.

Further, in the fifth embodiment, the cores 4a, 4b, 4c can be disposed at identical heights. Hence, when the cores 4a, 4b, 4c are molded integrally with the case 1, the cores 4a, 4b, 4c can be molded while being held down by identically shaped jigs, thereby eliminating the need to design jigs having different shapes for the respective cores 4a, 4b, 4c. With the configuration according to the fifth embodiment, therefore, a number of design processes relating to integral molding can be reduced in comparison with the configuration of the fourth embodiment.

According to the fifth embodiment, as described above, by employing the layout shown in FIG. 8 in order to make the total cooling performance uniform, balance can be achieved among the currents of the A phase, the B phase, and the C phase even when a curved duct is used and the cores are all molded integrally with the case at identical heights. As a result, similar effects to the fourth embodiment can be obtained, and the number of design processes relating to integral molding can be reduced.

Note that the switch element 2 may be realized by a MOS-FET, an IGBT, or a power module combining these components. Further, the control means mounted on the substrate may be realized by a microcomputer. The magneto-electric transducer 5 may be realized by a Hall element. Furthermore, the integral molding may be realized using insert molding.

Moreover, in this invention, the content described above in the first to fifth embodiments may be combined freely within the scope of the invention. Further, appropriate modifications and omissions may be implemented on the respective embodiments.

What is claimed is:

1. A current control apparatus comprising:
a switch element;
a first cooler that cools the switch element;
a bus bar connected to the switch element;
a first core penetrated by the bus bar and comprises a first gap;
a magneto-electric transducer inserted into the first gap, the magneto-electric transducer detecting a value of a current that flows through the bus bar to be supplied to the switch element;
a controller that controls the switch element, using the current value detected by the magneto-electric transducer;
a case that houses the switch element, the first core, the magneto-electric transducer, and the controller; and
a cover provided to cover an opening portion of the case so that an interior of the case is hermetically sealed,
wherein the first core includes an exposed disposal structure in which a part of the first core other than the first gap projects from the case and is exposed to an exterior of the case as an exposed portion,
the first gap is housed in the case and is not exposed to the exterior of the case; and
the current control apparatus further includes a divided cooling structure in which the exposed portion is cooled without being affected by a temperature of the first cooler that cools the switch element.

2. The current control apparatus according to claim 1, wherein the divided cooling structure includes a second cooler provided at a remove from the first cooler and that cools the exposed portion.

3. The current control apparatus according to claim 2, wherein a volume and a surface area of the second cooler and a coolant that is used by the second cooler are set individually, independently of the first cooler, so that the second cooler cools the exposed portion to a desired temperature, independently of the first cooler.

4. The current control apparatus according to claim 1, wherein the divided cooling structure comprises a duct connected to the first cooler and through which the exposed portion is inserted, and
the first cooler and the exposed portion are cooled by forcibly circulating a coolant that is used to cool the first cooler, through the duct by convection.

5. The current control apparatus according to claim 4, wherein the coolant is forcibly circulated through the duct by convection after defining a flow direction of the coolant such that the coolant flows to the first cooler via the exposed portion.

6. The current control apparatus according to claim 1, further comprising a plurality of cores,
the magneto-electric transducer is inserted into each of gaps respectively provided in the plurality of cores, and
when the plurality of cores are cooled by an effect that is obtained by combining a first cooling performance using the divided cooling structure and a second cooling performance using the exposed disposal structure, a total cooling performance that is obtained by combining the first cooling performance and the second cooling performance is uniform among the plurality of cores.

7. The current control apparatus according to claim 2, further comprising a plurality of cores, the magneto-electric transducer is inserted into each of gaps respectively provided in the plurality of cores, and when the plurality of cores are cooled by an effect that is obtained by combining a first cooling performance using the divided cooling structure and a second cooling performance using the exposed disposal structure, a total cooling performance that is obtained by combining the first cooling performance and the second cooling performance is uniform among the plurality of cores.

8. The current control apparatus according to claim 3, further comprising a plurality of cores, the magneto-electric transducer is inserted into each of gaps respectively provided in the plurality of cores, and when the plurality of cores are cooled by an effect that is obtained by combining a first cooling performance using the divided cooling structure and a second cooling performance using the exposed disposal structure, a total cooling performance that is obtained by combining the first cooling performance and the second cooling performance is uniform among the plurality of cores.

9. The current control apparatus according to claim 4, further comprising a plurality of cores, the magneto-electric transducer is inserted into each of gaps respectively provided in the plurality of cores, and when the plurality of cores are cooled by an effect that is obtained by combining a first cooling performance using the divided cooling structure and a second cooling performance using the exposed disposal structure, a total cooling performance that is obtained by combining the first cooling performance and the second cooling performance is uniform among the plurality of cores.

10. The current control apparatus according to claim 5, further comprising a plurality of cores, the magneto-electric transducer is inserted into each of gaps respectively provided in the plurality of cores, and when the plurality of cores are cooled by an effect that is obtained by combining a first cooling performance using the divided cooling structure and a second cooling performance using the exposed disposal structure, a total cooling performance that is obtained by combining the first cooling performance and the second cooling performance is uniform among the plurality of cores.

11. A manufacturing method for the current control apparatus according to claim 1, the manufacturing method comprising integrally molding the core with the case in a condition in which the exposed portion is exposed to the exterior of the case.

12. The current control apparatus according to claim 1, further comprising:

a second core penetrated by the bus bar and comprising a second gap in which the magneto-electric transducer is inserted, the second core being parallel to the case; and a third core penetrated by the bus bar and comprising a third gap in which the magneto-electric transducer is inserted, the third core being recessed within the case.

* * * * *